United States Patent
D'Souza et al.

(10) Patent No.: US 10,312,872 B2
(45) Date of Patent: Jun. 4, 2019

(54) MANAGING A SHOOT-THROUGH CONDITION IN A COMPONENT CONTAINING A PUSH-PULL OUTPUT STAGE

(71) Applicant: Aura Semiconductor Pvt. Ltd, Bangalore (IN)

(72) Inventors: Arnold J D'Souza, Bangalore (IN); Shyam Somayajula, Bangalore (IN)

(73) Assignee: Aura Semiconductor Pvt. Ltd, Bangalore (IN)

(*) Notice: Subject to any disclaimer, the term of this patent is extended or adjusted under 35 U.S.C. 154(b) by 0 days.

(21) Appl. No.: 15/964,102

(22) Filed: Apr. 27, 2018

(65) Prior Publication Data
US 2018/0316322 A1 Nov. 1, 2018

(30) Foreign Application Priority Data
Apr. 28, 2017 (IN) .............................. 201741015165

(51) Int. Cl.
| | |
|---|---|
| H03F 3/26 | (2006.01) |
| H03F 3/21 | (2006.01) |
| H03F 3/185 | (2006.01) |
| H03F 1/02 | (2006.01) |
| H03F 3/187 | (2006.01) |
| H03F 3/213 | (2006.01) |
| H03F 3/30 | (2006.01) |
| H04R 3/00 | (2006.01) |

(52) U.S. Cl.
CPC ........... *H03F 3/265* (2013.01); *H03F 1/0227* (2013.01); *H03F 3/185* (2013.01); *H03F 3/187* (2013.01); *H03F 3/21* (2013.01); *H03F 3/213* (2013.01); *H03F 3/3035* (2013.01); *H03F 3/3064* (2013.01); *H03F 2200/03* (2013.01); *H03F 2200/33* (2013.01); *H03F 2203/45528* (2013.01); *H03F 2203/45594* (2013.01); *H04R 3/00* (2013.01)

(58) Field of Classification Search
CPC ....................................................... H03F 3/265
See application file for complete search history.

(56) References Cited

U.S. PATENT DOCUMENTS

| | | | |
|---|---|---|---|
| 4,922,131 A | * | 5/1990 | Anderson ................. H03F 1/56 327/53 |
| 5,061,902 A | | 10/1991 | Carpenter |
| | | | (Continued) |

*Primary Examiner* — Patricia T Nguyen
(74) *Attorney, Agent, or Firm* — IPHorizons PLLC; Nerendra Reddy Thappeta

(57) ABSTRACT

Shoot-through condition in a component containing an amplifier with a push-pull output stage is managed. A first current in a first transistor of the output stage is mirrored to generate a first mirrored current. A second current in a second transistor of the output stage is mirrored to generate a second mirrored current. A sum of the first mirrored current and said second mirrored current is generated. When a magnitude of the sum exceeds a first pre-determined threshold, a respective control voltage of the first transistor and the second transistor is adjusted to reduce the first current and the second current at least until the sum falls below a second pre-determined threshold. In an embodiment, the first pre-determined threshold equals the second pre-determined threshold. In an embodiment, the component is a class-L power amplifier.

14 Claims, 9 Drawing Sheets

(56) References Cited

U.S. PATENT DOCUMENTS

| | | | | |
|---|---|---|---|---|
| 5,233,314 A | * | 8/1993 | McDermott | H03L 7/0898 |
| | | | | 327/157 |
| 5,361,041 A | * | 11/1994 | Lish | H03F 3/3001 |
| | | | | 330/255 |
| 5,412,309 A | | 5/1995 | Ueunten | |
| 5,523,715 A | | 6/1996 | Schrader | |
| 5,939,944 A | | 8/1999 | Gibson | |
| 6,166,971 A | * | 12/2000 | Tamura | G11C 7/1012 |
| | | | | 365/191 |
| 6,614,306 B1 | | 9/2003 | Morrish | |
| 7,224,135 B1 | | 5/2007 | Menegoli | |
| 7,706,545 B2 | | 4/2010 | Kost et al. | |
| 8,471,627 B2 | | 6/2013 | Slavov | |
| 8,482,346 B2 | | 7/2013 | Stanley | |
| 8,493,146 B2 | | 7/2013 | Konecny et al. | |
| 8,497,734 B2 | | 7/2013 | Stanley | |
| 2016/0134239 A1 | | 5/2016 | Curtis | |
| 2017/0133989 A1 | * | 5/2017 | Dykstra | H03F 1/3205 |

* cited by examiner

MANAGING A SHOOT-THROUGH CONDITION IN A COMPONENT CONTAINING A PUSH-PULL OUTPUT STAGE

PRIORITY CLAIM

The instant patent application is related to and claims priority from the co-pending provisional India patent application entitled, "Current Shoot through protection in Class AB amplifier", Serial No.: 201741015165, Filed: 28 Apr. 2017, which is incorporated in its entirety herewith to the extent not inconsistent with the description herein.

BACKGROUND

Technical Field

Embodiments of the present disclosure relate generally to components containing push-pull output stages, and more specifically to managing a shoot-through condition in a component containing a push-pull output stage.

Related Art

Output stages are integral to many components which generate various types of output signals. As is well known, an output stage refers to the last processing stage of a component from which the corresponding output signal is provided. Power amplifiers, CMOS digital circuits, etc., are examples of such components which employ output stages to provide the output signal.

A push-pull output stage is a type of output stage containing a pair of transistors, with one transistor being driven to source current into an output node from which the output signal is provided, while the second transistor is driven to sink current from the output node. In a single-ended configuration, the push-pull output stage is as noted above. In a differential configuration, the push-pull output stage has a pair of transistors corresponding to each of the signals in the differential pair.

In a desired normal operation mode in single-ended configuration, at the most only one of the pair of transistors carries substantial current in a given interval, while the other carries only quiescent current. Correspondingly, in a differential configuration, one transistor of each pair carries substantial current, while the other transistor of each pair carries only quiescent current.

A shoot-through condition is said to be present when each of the pair of transistors in a single-ended configuration (or the corresponding transistors in a differential configuration) carry large currents (such large currents flowing between power and ground terminals of the output stage), which is known to be undesirable. Aspects of the present disclosure relate to managing such shoot-through conditions in components containing push-pull output stages.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present disclosure, a shoot-through condition in a component containing an amplifier with a push-pull output stage is managed. A first current in a first transistor of the output stage is mirrored to generate a first mirrored current. A second current in a second transistor of the output stage is mirrored to generate a second mirrored current. A sum of the first mirrored current and said second mirrored current is generated. When a magnitude of the sum exceeds a first pre-determined threshold, a respective control voltage of the first transistor and the second transistor is adjusted to reduce the first current and the second current at least until the sum falls below a second pre-determined threshold. In an embodiment, the first pre-determined threshold equals the second pre-determined threshold.

In an embodiment, the component is a class-L amplifier containing a DC-DC converter and a power amplifier. The power amplifier is powered for operation by a regulated voltage generated by the DC-DC converter. The power amplifier receives an input signal and generates a corresponding amplified signal as an output of the push-pull stage. The DC-DC converter also receives the amplified signal, and generates the regulated voltage to have an instantaneous magnitude greater than an instantaneous magnitude of the absolute value of the output signal by a second pre-determined value.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Component

Figure 1:
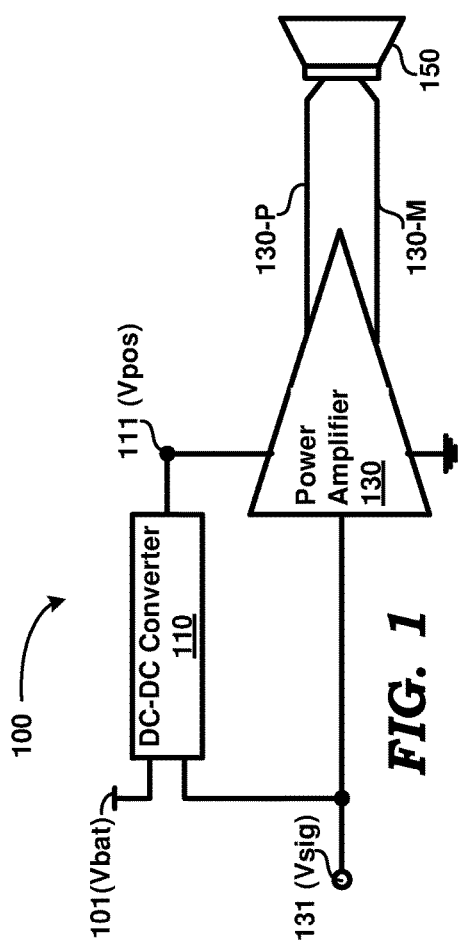
FIG. 1 is a block diagram of an example component in which several aspects of the present disclosure can be implemented.

FIG. 1 is a block diagram of an example component in which several aspects of the present disclosure can be implemented. Component 100 is shown containing DC-DC converter 110, power amplifier 130 and speaker 150.

Power amplifier 130, which may be a class AB or push-pull power amplifier, receives a signal Vsig (131) (which may, for example, be an audio signal) and generates a corresponding power-amplified output across terminals 130-P and 130-M, which drives speaker 150. Power amplifier 130 receives regulated voltage 111 (Vpos) for operation from DC-DC converter 110. DC-DC converter 110 receives signal Vsig, and power from power source 101 (which may be a battery and herein referred to as Vbat 101). DC-DC converter 110 generates regulated voltage Vpos such that Vpos is always slightly larger than the maximum of voltages 130-P and 130-M by a desired predetermined magnitude (termed headroom, as noted below). Thus, the power supply to power amplifier 130 is modulated based on the instantaneous voltage of the power-amplified output (or equivalently based on the input signal Vsig or an intermediate signal such as the output of a pre-amplifier providing voltage gain to Vsig, such an amplifier being referred to as a class-L amplifier). As a result, efficiency of power amplifier 130 is enhanced. In an embodiment, component 100 is a class-L amplifier, and is described in detail in U.S. Pat. No. 9,319,495, entitled 'Power Amplifier Providing High Efficiency', which is incorporated in its entirety herewith. Component 100 may be implemented in integrated circuit (IC) form. Class-L modulation is further illustrated herein with respect to FIGS. 2A and 2B.

Figure 2A:
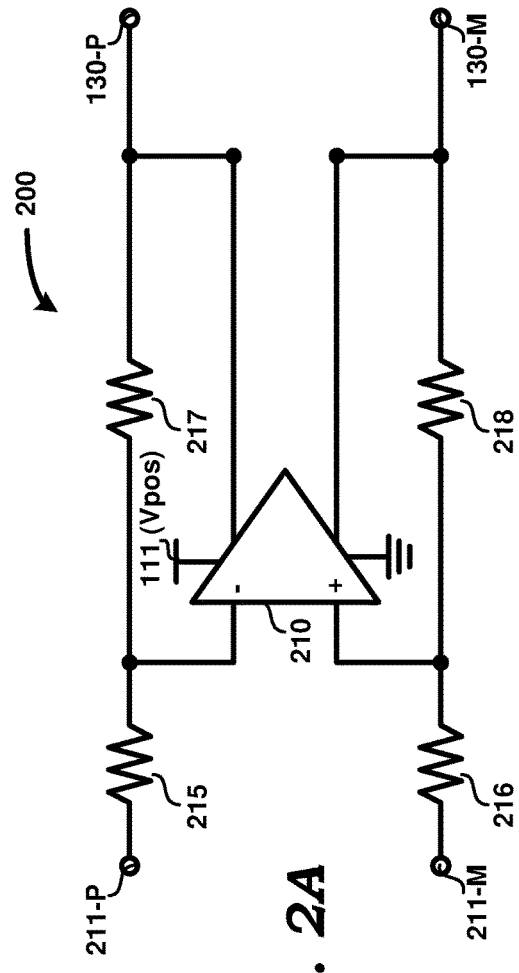
FIG. 2A shows the details of power-amplification stage of a power amplifier with a push-pull output stage in an embodiment of the present disclosure.

FIG. 2A shows the power-amplification stage 200 of power amplifier 130, in an embodiment of the present disclosure. Other details of power amplifier 130 are not shown in the interest of conciseness. Power-amplification stage 200 is shown containing gain block 210, and resistors 215, 216, 217 and 218. Power-amplification stage 200 is designed for single-supply operation, and is powered by Vpos. Terminal marked GND represents a ground terminal. Resistors 215, 216, 217 and 218 set the gain of gain block 210, which receives a signal across 211-P and 211-M (which may be obtained by providing voltage gain to Vsig by a pre-amplifier stage, not shown, in power amplifier 130). Stage 200 provides power amplification to signal 211-P/211-M signal to generate a power-amplified output signal across terminals 130-P and 130-M.

Figure 2B:
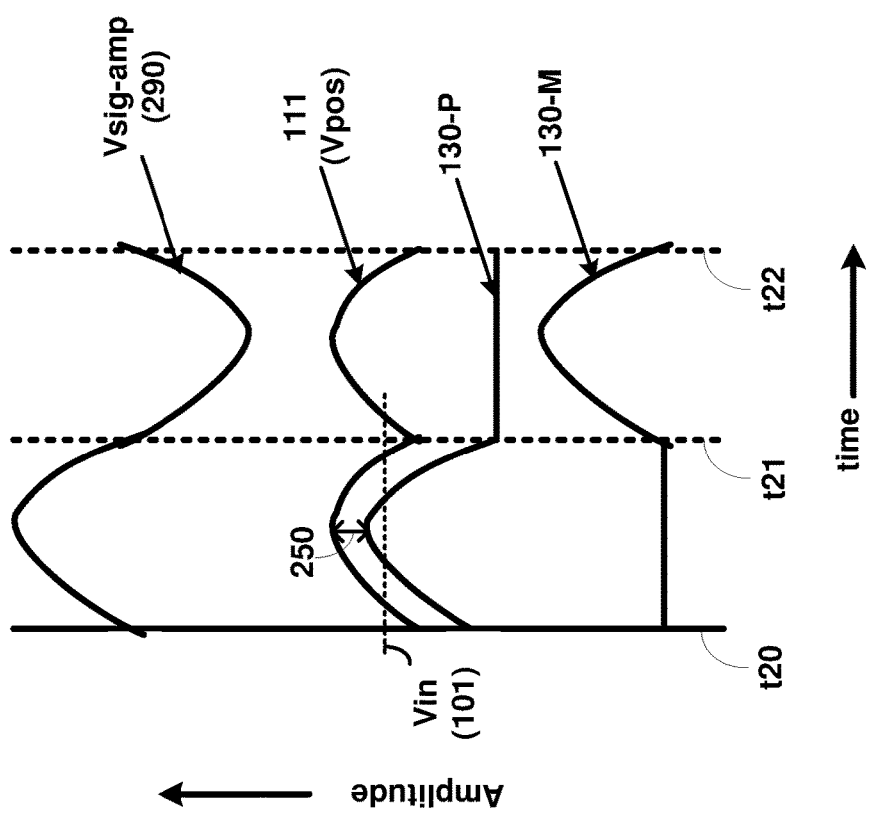
FIG. 2B is an example diagram illustrating the manner in which a regulated voltage is modulated in an embodiment of the present disclosure.

FIG. 2B is an example diagram illustrating the manner in which Vpos (111) is modulated based on the instantaneous voltage of amplified output signal 130-P/130-M, in an embodiment of the present disclosure. Each of signals 130-P and 130-M is shown as a half sine wave which together differentially represent a sine wave 290 (Vsig-amp). Vsig-amp (290) is a power-amplified version of signal 211-P/211-M. Regulated output voltage Vpos is shown 'tracking' the higher of signals 130-P and 130-M. Although a single tone (pure sine wave) is shown in the illustration of FIG. 2B, in an embodiment, such tracking may be provided over the entire range of audio frequencies (20 Hz to 20 KHz) of signals 130-P/130-M. Marker 250 represents the instantaneous difference between Vpos 111 and the voltage of the greater of signals 130-P and 130-M (or equivalently the instantaneous absolute value (disregarding polarity or sign) of Vsig-amp 290). The instantaneous difference between Vpos and the larger of 130-P/130-M is termed 'headroom', and is indicated by marker 250.

Figure 3A:
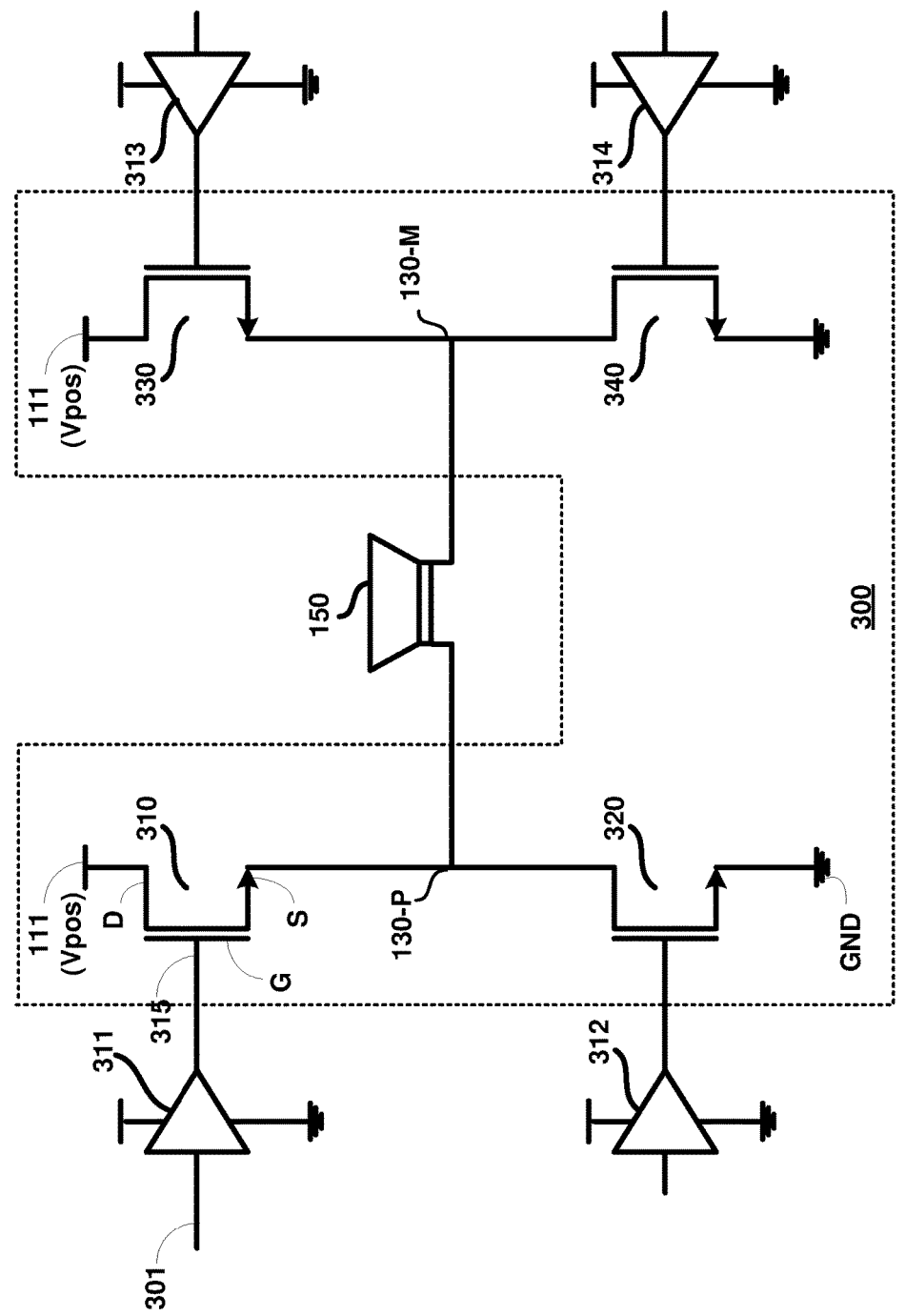
FIG. 3A is a diagram showing the output stage of an amplification stage of a power amplifier in a differential configuration in an embodiment of the present disclosure.

FIG. 3A is a diagram showing a push-pull output stage 300 of gain block 210 (or equivalently, of power-amplification stage 200 (output stage 300 being therefore the output stage of power amplifier 130 also) in a differential configuration in an embodiment. Additionally, buffers/drivers 311, 312, 313 and 314, as well as speaker 150, are also shown in FIG. 3A. Output stage 300 is shown containing transistors 310, 320, 330 and 340. In the example, each of transistors 310, 320, 330 and 340 is implemented as an N-type Metal Oxide Semiconductor (NMOS) transistor. The source, gate and drain terminals of NMOS transistor 310 are marked in FIG. 3 by the letters S, G and D respectively. The terminals of the other switches are not marked, but can be identified by the drawing convention used for the switches. "GND" represents a ground terminal. In an alternative embodiment, at least some of transistors 310, 320, 330 and 340 (e.g., (for example in place of transistors 310 and 330) may be implemented as P-type Metal Oxide Semiconductor (PMOS) transistor (with appropriate modification of the driving circuits/buffers), as would be apparent to one skilled in the relevant arts.

Buffers/drivers 311, 312, 313 and 314, are connected to the gate terminals of NMOS transistors 310, 320, 330 and 340. Buffers/drivers 311, 312, 313 and 314 may be powered by a power source other than Vpos, and generated internally in power amplifier 130 or in DC-DC converter 110 and provided to power amplifier 130. The voltage applied by the buffers on the gate terminals of the corresponding transistors depends on the instantaneous value of signal 211-P/211-M, and are designed to generate a power-amplified version of signal 211-P/211-M (and therefore of Vsig 131) across terminals 130-P and 130-M. The drain terminals of transistors 310 and 330 are each connected to Vpos (111). Buffer 311 is shown receiving an input signal 301 and providing a corresponding buffered output 315. Each of buffers 360, 370 and 380 also receives corresponding inputs (not marked) and provides corresponding drive signals (also not shown).

In normal operation (i.e., when no shoot-through exists), transistors 310 and 340 can carry large currents corresponding to when 130-P is as shown in interval t20-t21 in FIG. 2B, while transistors 320 and 330 carry only a quiescent current. Quiescent current represents the magnitude of current that is designed to flow through a transistor of output stage 300 when that transistor does not carry a current component due to the corresponding input signal (i.e., the quiescent current is the magnitude of current through the transistor under zero-signal conditions. The quiescent current in each transistor of output stage 300 may be set by one or more biasing circuits (not shown). As is well-known in the relevant arts, such biasing may be provided to minimize cross-over distortion in push-pull amplifiers (or class AB amplifiers) such as power amplifier 130.

Corresponding to when 130-M is as shown in interval t21-t22, transistors 320 and 330 can carry large currents, while transistors 310 and 340 carry only a quiescent current. However, it is possible that either the transistor pair 310/320, or transistor pair 330/340 carry large currents (for example larger than a maximum value), a condition referred to as an overdrive or shoot-through condition. Such an over-drive condition can occur for example when the output signal 130-P/130-M of power amplifier 130 gets clipped due to the value of Vpos becoming temporarily less than the magnitude of the output signal. Under, or slightly after such condition occurs (typically when the gain block 210 is coming out of, or recovering from, the over-drive condition). The gate voltages (i.e., voltage applied to the gate terminal) of the power transistors 310 and 320, or 330 and 340, of output stage 300 are driven to power supply levels of the corresponding buffers during such clipped conditions.

Figure 3B:
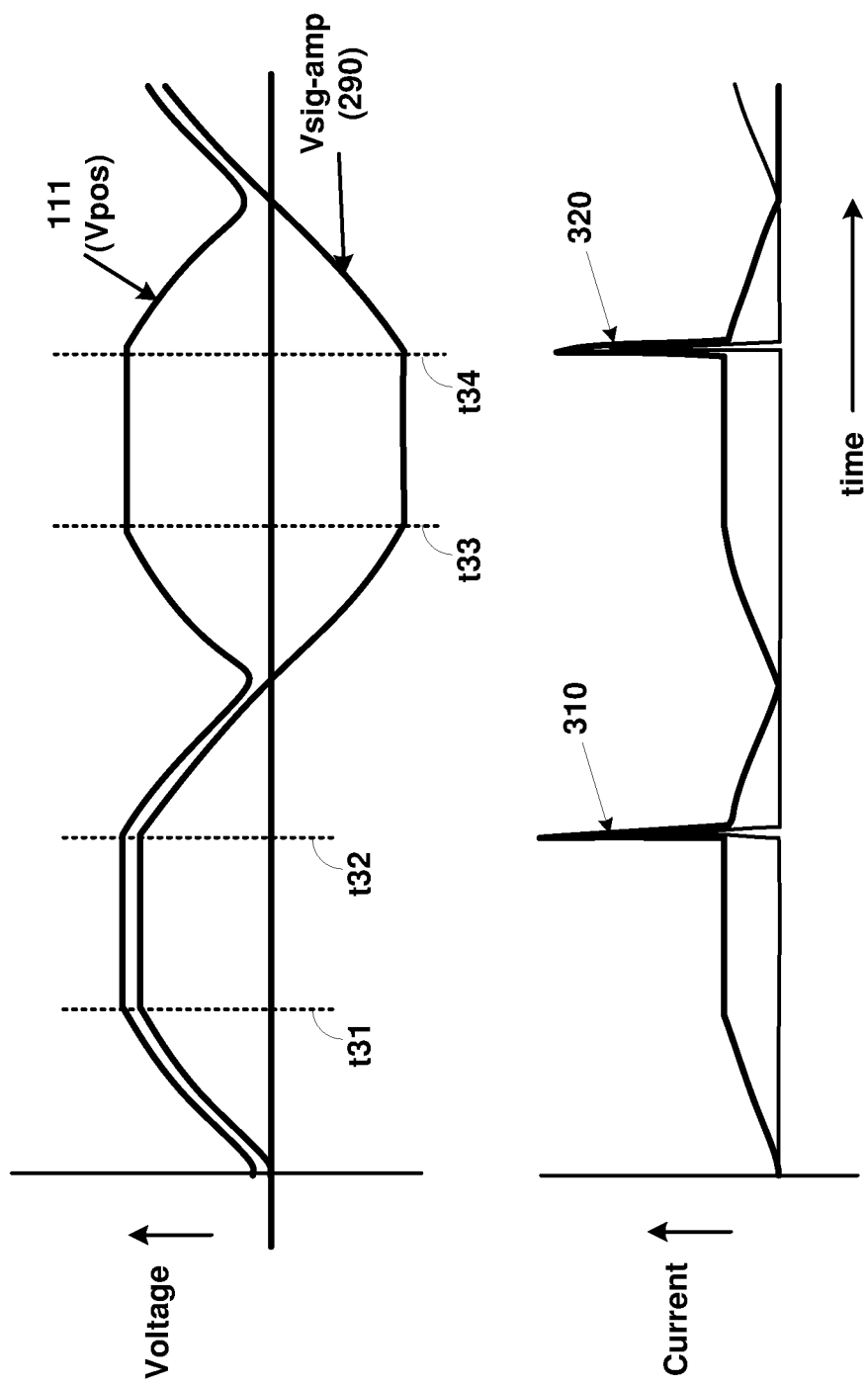
FIG. 3B is a diagram illustrating relevant voltages and currents of an output stage during a shoot-through condition in an embodiment of the present disclosure.

FIG. 3B illustrates the relevant voltages and currents of output stage 300 during an overdrive or shoot-through condition. Due to limited Vpos, signal 290 (Vsig-amp) is shown clipped in time intervals t31-t32 and t33-t34. When the clipping condition is removed (as at t32 and t34), the internal amplifiers (e.g., 210) in power amplifier 130 and the gate voltages of the output power transistors 310, 320, 330 and 340 start recovering and approach their steady state values. However, such recovery takes a finite amount of time.

Further, the recovery of the gate voltages of the power transistors may not be symmetric (i.e., may not occur at the same time instance). At or during recovery, the gate voltages of the power transistors may be in a state which allows all four transistors 310, 320, 330 and 340 to carry large currents, as indicated by arrows 310 and 320. Such shoot-through currents flow directly from Vpos (111) to ground, and do not contribute to the output current that should flow through speaker 150. Such shoot-through currents can result in efficiency loss in power amplifier 130 and/or device failure of corresponding portions of power amplifier 130.

In a single-ended output implementation of output stage 300, only transistors 310 and 320 (or 330 and 340) would be present, and speaker 150 would be connected between the junction of the two transistors and ground. The two transistors would be driven by a corresponding pair of buffers, such that transistor 310 (or 330) sources current to the output node, while transistor 320 (or 340) sinks current from the output node. Shoot-through can occur when both transistors 310 and 320 (or both transistors 330 and 340) carry large currents (for example, greater than maximum). Several aspects of the present disclosure apply to removing shoot-through conditions in power amplifiers providing differential or single-ended outputs.

The manner in which shoot-through conditions in component 100 are detected and managed is described next with examples.

3. Detection of Shoot-Through Condition

Figure 4:
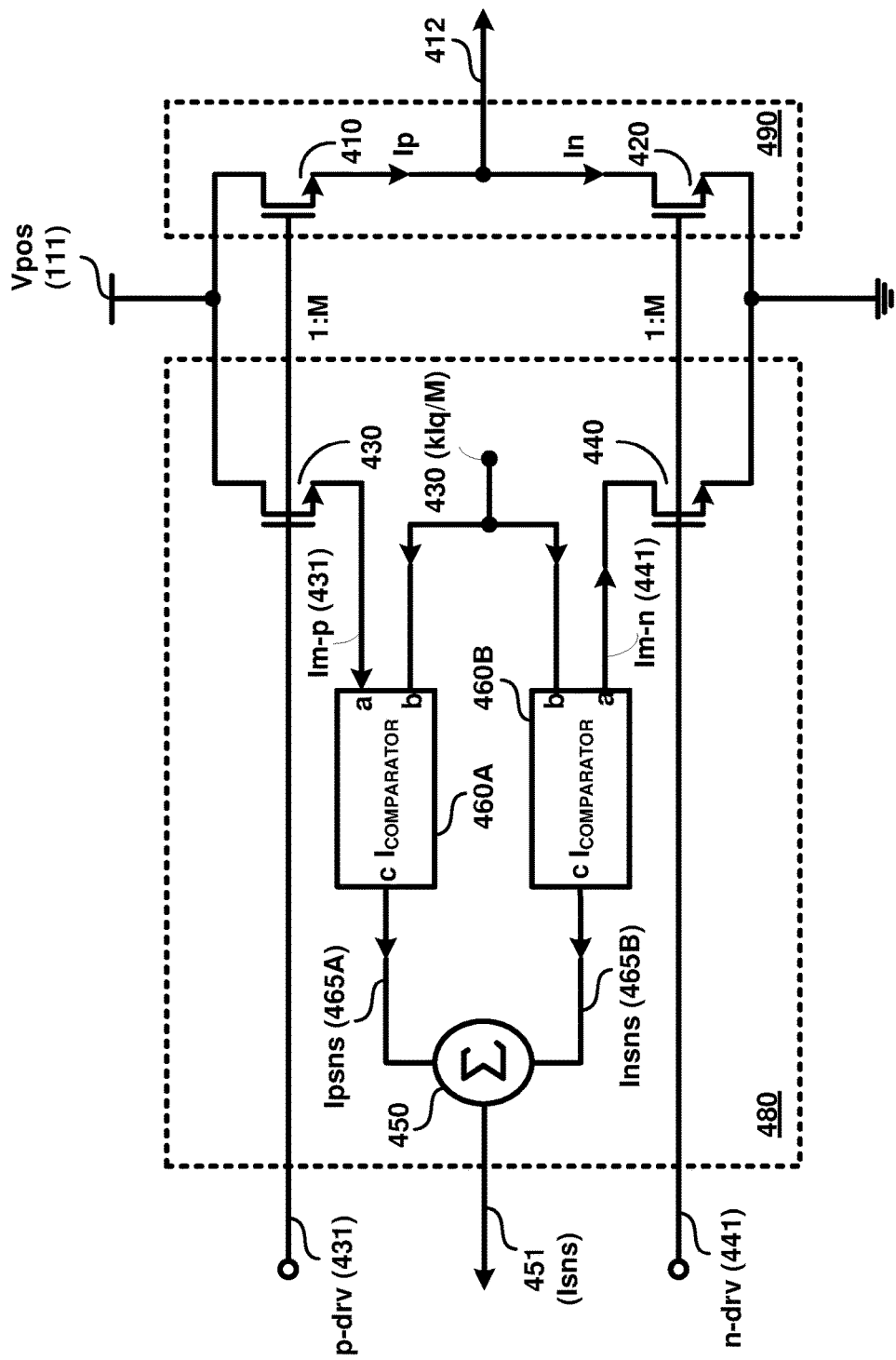
FIG. 4 is a block diagram illustrating an output stage and a sensing block used to sense currents in transistors of the output stage, in an embodiment of the present disclosure.

FIG. 4 is a block diagram illustrating a push-pull output stage of a power amplifier (e.g., power amplifier 200) and a sensing block used to sense currents in transistors of the push-pull output stage, in an embodiment of the present disclosure. Merely for ease of description, the details of FIG. 4 are provided in the context of an output stage implemented in single-ended configuration. However, it is to be understood that similar detection techniques can be used in the context of an output stage implemented to provide differential outputs also, as will be apparent to one skilled in the relevant arts upon reading the disclosure herein.

FIG. 4 is shown containing output stage 490, and sensing block 480. Output stage 490 corresponds to a single-ended implementation of output stage 300 of FIG. 3, and is shown containing a source-side transistor 410 and a sink-side transistor 420, which are each implemented as NMOS transistors. In an alternative embodiment, transistor 410 may be implemented as a PMOS transistor 210 transistor, with transistor 420 being NMOS. Continuing with reference to FIG. 4, node 412 represents the output node of power amplifier 130, when implemented in a single-ended output configuration. A speaker (not shown) may be connected between node 412 and ground. In a differential implementation as in output stage 300 of FIG. 3, a pair of sensing blocks (such as 480), one for each of transistor pairs 310/320 and 330/340, would be present. The directions of the various currents in FIG. 4 are indicated by the corresponding arrows, although the directions may be different depending on the specific implementation of the circuit of FIG. 4.

Sensing block 480 is shown containing NMOS 430 and NMOS 440, current comparators (Icomparators) 460A and 46B, and current summer 450. Each of transistors 430 and 410 receives the same gate driving signal p-dry (431), which is generated by a driver (not shown). Each of transistors 440 and 420 receives the same gate driving signal n-dry (441), which is generated by another driver (also not shown). The magnitudes (voltages) of signals p-dry and n-dry are generated based on an input signal (such as 131 Vsig of FIG. 1) to be amplified and the desired power gain to be provided to generate amplified output signal 412 of power amplifier 130. When a shoot-through condition exists, the magnitudes (voltages) of signals p-dry and n-dry may be adjusted (as described below) to remove the shoot-through condition, as described in detail below. In the description provided herein, the adjustment is a reduction of the voltages at p-dry and n-dry due to transistors of the output stage being NMOS. However, the adjustment can in general be either reduction or increase of the voltages corresponding to p-dry and n-dry depending on whether the transistors of the output stage are NMOS or PMOS.

Transistor 430 is connected to mirror the current Ip flowing through transistor 410. The dimensions (e.g., channel width) of transistors 430 and 410 are in the ratio 1:M (M may be a large number, e.g., greater than 200, to avoid loss of efficiency). Thus, the mirrored current Im-p (431) in transistor 430 has a magnitude that is 1/M of the current Ip through transistor 410. Similarly, transistors 440 and 420 form a current mirror pair, with the current ratios In to Im-n (441) in transistors 440 and 430 being 1:M.

Current comparator 460A receives current Im-p (431) on terminal 'a', k*Iq/M on terminal 'b' and provides a current Ipsns 465A (first error current) on terminal 'c'. Current comparator 460B receives current Im-n (441) on terminal 'a', k*Iq/M on terminal 'b' and provides a current Insns 465A (second error current) on terminal 'c'. The currents received on the 'b' terminals of each of comparators 460A and 460B is a fixed current 430 (reference current, generated by a current source not shown) of magnitude k*Iq/M, wherein Iq represents the value of the quiescent current that may flow through transistors 410 and 420, and k is a constant. Current comparators 460A and 460B may be implemented in a known way, which would be apparent to one skilled in the relevant arts upon reading the disclosure herein.

Each of current comparators 460A and 460B receives currents on terminals 'a' and 'b', and generates a current on terminal 'c' based on the values of currents on terminals 'a' and 'b'. Denoting the currents in terminals 'a', 'b', and 'c' of a comparator generically as Ia, Ib and Ic respectively, the currents Ia, Ib and Ic in each of 460A and 460B are related according to the following equation:

$$Ic = \max\{[|Ib| - \max((|Ib| - |Ia|), 0)], 0\} \qquad \text{Equation 1}$$

wherein, max (x,y) operation provides the 'maximum of' (or greater of) the variables x and y, and

|x| represents the absolute value of x, i.e., magnitude of x without regard to sign, (Thus, for example |Ib| represents the absolute value of the magnitude of current Ib, ignoring polarity/direction of Ib).

From Equation 1, the below results follow:

If Ia is less than Ib, then max(|Ib|−|Ia|,0)=|Ib|−|Ia|.

Therefore, $Ic=\max\{|Ib|-(|Ib|-|Ia|),0\}=Ia=Ip/M$  Result 1.

If Ia is greater than or equal to Ib, then max(|Ib|−|Ia|,0)=0,

Therefore $Ic=\max\{|Ib|-0,0\}=Ib=kIq/M$  Result 2.

Applying Equation 1 and results 1 and 2 of above to comparator 460A, it follows that:

for values of Ip from zero to k*Iq (upper limit), Ipsns equals Ip/M, and is always less than k*Iq/M; and for values of Ip greater than k*Iq, Ipsns equals k*Iq/M, k being as noted above.

Similarly, applying Equation 1 to comparator 460B, it follows that:

for values of In from zero to k*Iq, Insns equals In/M, and is always less than k*Iq/M; and for values of In greater than k*Iq, Insns equals K*Iq/M.

Summer 450 (current summer) adds the error currents Ipsns and Insns to generate current Isns 451 (sum current) on an output terminal of block 480. The magnitude of Isns is indicative of existence of a shoot-through condition, i.e., each of Ip and In equals or exceeds an upper limit ((0.75*k*Iq), for example). As noted above, the magnitude of such upper limit may be set by the value of 'k'. Current Isns generated by sensing block 480 may be processed suitably to enable control of control (gate) terminals 431 and 441 of transistors 410 and 410 so as to remove the shoot-through condition. An example circuit for such control of the gate terminals of the transistors in the output stage is illustrated next with respect to FIG. 5.

Figure 5:
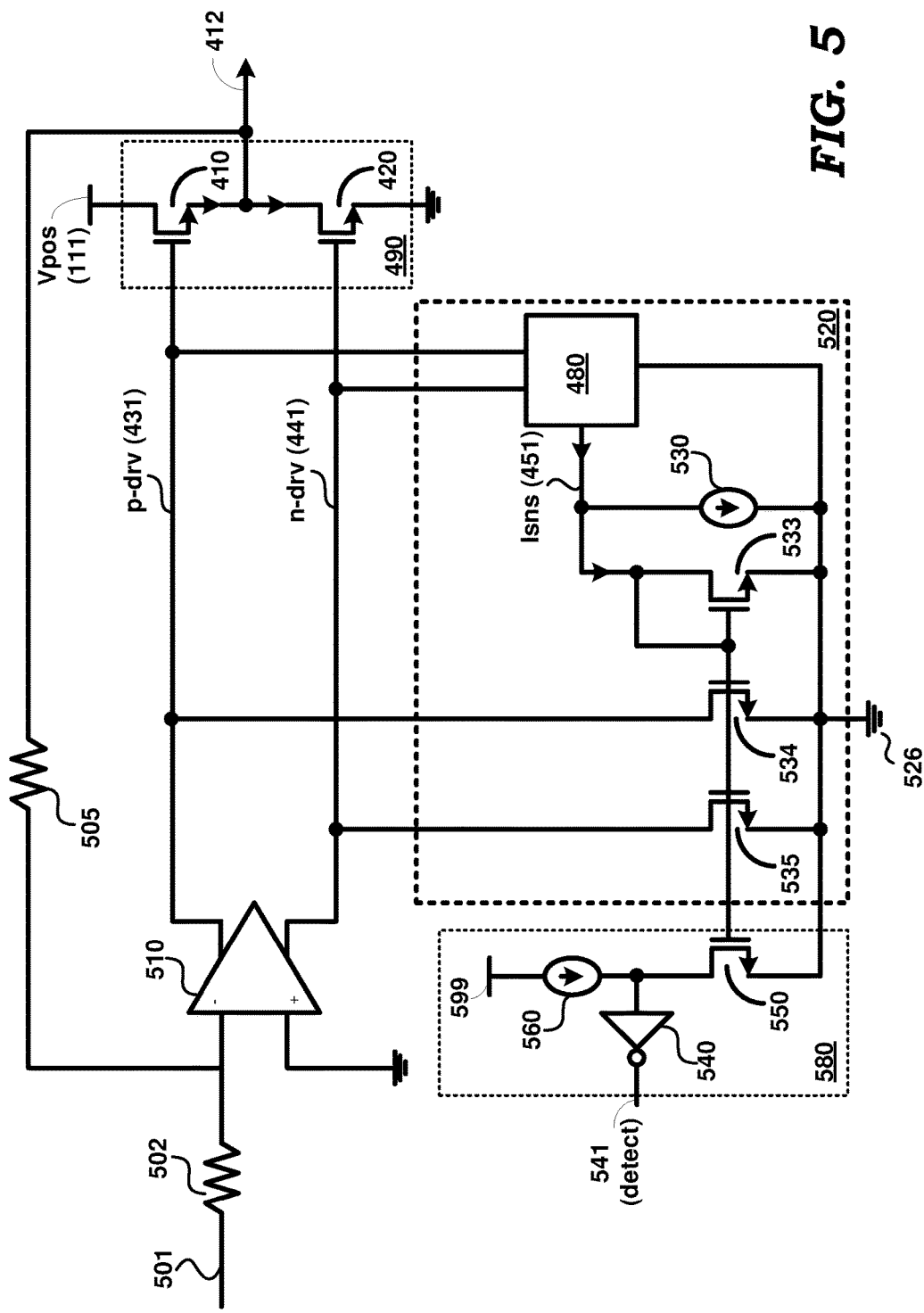
FIG. 5 is diagram illustrating the manner in which a shoot-through condition is removed in an embodiment of the present disclosure.

FIG. 5 is diagram illustrating the manner in which a shoot-through condition is removed in an embodiment of the present disclosure, and is shown containing analog shoot-through control block 520 and detection block 580. For clarity, output stage 490, gain block 510 and resistors 502 and 505 are also shown in FIG. 5. Signal 501 corresponds to signal 211-P/211-M of FIG. 2, but shown in single-ended form for ease of description. Resistors 502 and 505 set the again of gain block 510, which corresponds to gain block 210 of FIG. 2, and generates gate drive signals p-dry (431) and n-dry (431).

Analog shoot-through control block 520 is shown containing sensing block 480, current sink 530 (constant current sink), and transistors 533, 534 and 535. As described with respect to FIG. 4, sensing block 480 generates a current Isns (451) as a function of currents through transistors 410 and 420. Transistors 533 and 534 are connected in a current-mirror configuration (and form a 'third current mirror'), with transistor 534 being connected across node 431 and ground. Transistors 533 and 535 are connected in a current-mirror configuration (and form a 'fourth current mirror') with transistor 535 being connected across node 441 and ground. Current sink 530 sinks a constant current from node 451, the constant current in an embodiment equal to 1.5*k*Iq/M (first pre-determined threshold). Therefore, as along as Isns is less than or equal to current 530 (i.e., 1.5*k*Iq/M), the gate voltage applied to transistors 533, 534 and 535 is zero, and transistors 533, 534 and 535 are all switched off.

When Isns begins to exceed (increases to slightly greater than) the value 1.5*k*Iq/M (corresponding to when each of Ip and In begin to exceed an upper limit (0.75*k*Iq) for example), each of transistors 533, 534 and 535 is switched ON, and has a current flowing through it. Therefore, the voltage on each of nodes 431 and 441 are reduced, so as to reduce Ip and In, and therefore Isns. When Isns begins to fall below the first pre-determined threshold, the shoot-through condition is deemed to no longer exist, and transistors 533, 534 and 535 are switched OFF. The voltages on nodes 431 and 441 may be viewed as control voltages of (or applied to) transistors 410 ad 420 respectively, since these voltages determine the magnitude of Ip and In.

Analog shoot-through control block 520 is always (i.e., continuously) operational. Thus, if Isns were to exceed the first pre-determined threshold again (i.e., after having fallen below the first-predetermined threshold), each of transistors 533, 534 and 535 is again switched ON until Isns again falls below the first pre-determined threshold, and so on. Such (continuous or analog) operation is in contrast to an operation, in which a shoot-through condition is monitored (and removed) only every once in a while, for example at regular intervals.

In another embodiment, analog shoot-through control block 520 is modified such that transistors 533, 534 and 535 are switched ON as Isns beings to exceed the first pre-determined threshold, but transistors 533, 534 and 535 are switched OFF only when Isns begins to fall below a second pre-determined threshold (for example less than the first pre-determined threshold).

Detection block 580 asserts (e.g., to logic high) a binary signal 541 (detect) when Isns begins to exceed the first pre-determined threshold. Detection block 580 de-asserts (e.g., to logic low) the binary signal 541 (detect) when Isns beings to fall below the first pre-determined threshold. In an alternative embodiment, detection block 580 de-asserts the binary signal 541 (detect) only when Isns beings to fall below the second pre-determined threshold. Detection block 580 is shown containing transistor 550, current source 560 and inverter 540. Transistor 550 is powered by a voltage 599, which may be internally generated in power amplifier 130. When Isns begins to exceed the first pre-determined threshold, transistor 550 is switched ON, and inverter 540 asserts 541 (detect). When Isns begins to fall below the first pre-determined threshold (or the second pre-determined threshold in the alternative embodiment), transistor 550 is switched OFF, and inverter 540 de-asserts 541 (detect).

In the context of a differential implementation of an output stage, two instances of circuit portion 480 of FIG. 4 and analog shoot-through control block 520 may be employed. One instance of blocks 480 and 520 may be used to remove shoot-through condition in one arm (e.g., corresponding to 410 and 420) of the differential output, and a second instance of blocks 480 and 520 may be used to remove shoot-through condition in the other arm, as would be apparent to one skilled in the relevant arts upon reading the disclosure herein.

Figure 6:
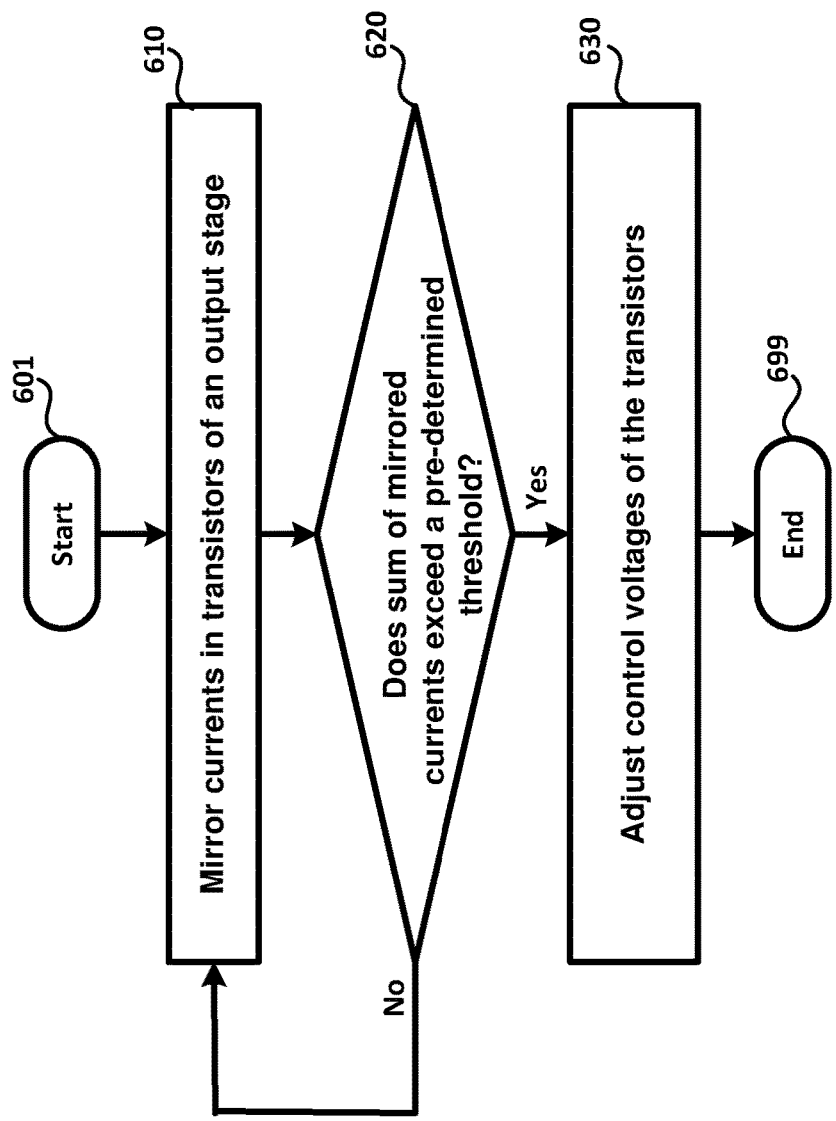
FIG. 6 is a flowchart illustrating the manner in which a shoot-through condition in an output stage of a component is managed, in an embodiment of the present disclosure.

FIG. 6 is a flowchart illustrating the manner in which a shoot-through condition in an output stage of a component is managed, in an embodiment of the present disclosure. Although the steps of the flowchart are shown to be in sequential order, some or of all of the steps may be concurrently and repeatedly/continuously executed. The flowchart starts in step 601, in which control immediately passes to step 610.

In step 610, currents in transistors of an output stage are mirrored using respective current mirrors to generate respective mirrored currents. Control then passes to step 620.

In step 620, it is determined if a sum of the mirrored currents exceeds a first pre-determined threshold, and if so control passes to step 630. Otherwise, control passes to step 610.

In step 630, the respective control voltages of transistor of the output stage are adjusted to reduce the currents in the transistors of the output stage until the sum of the mirrored currents falls below the first pre-determined threshold. In an alternative embodiment, the adjustment of the respective control voltages is performed until the sum of the mirrored currents falls below a second pre-determined threshold. Control then passes to step 699, in which the flowchart ends. However, the operations of the steps described above may be performed repeatedly.

Detect signal (541) can be used to further manage shoot-through conditions when component 100 is a class-L amplifier, as described next.

4. Control of Headroom in DC-DC Converter

Figure 7:
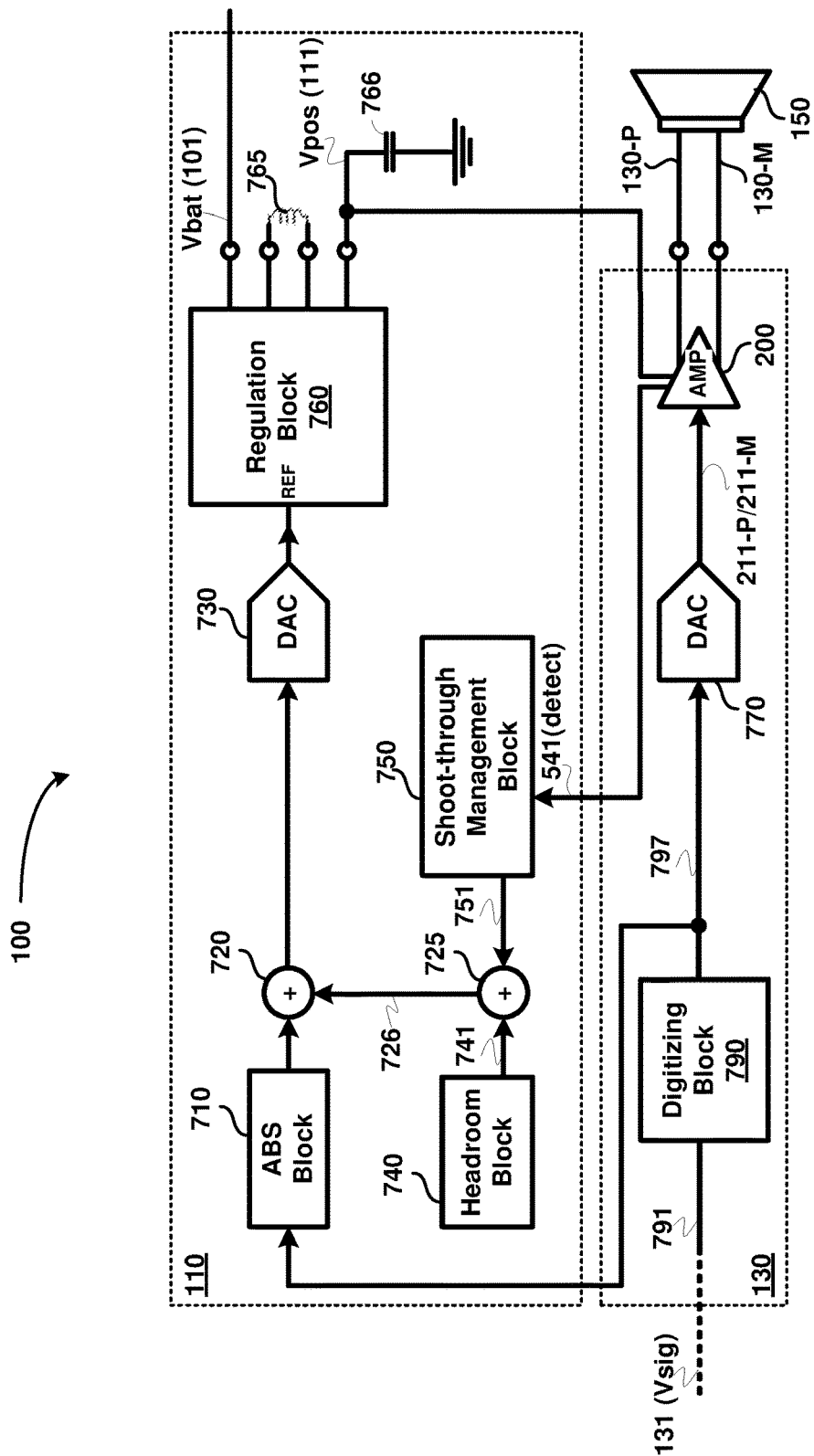
FIG. 7 is a block diagram illustrating relevant internal details of a DC-DC converter and a power amplifier employed in a class-L amplifier, in an embodiment of the present disclosure.

According to an aspect of the present disclosure, when a shoot-through condition is detected, the headroom (e.g., as indicated by marker 250 in FIG. 2B) between Vpos (111) and the corresponding absolute value of the amplified output of power simplifier 130 is increased. FIG. 7 is a block diagram illustrating the relevant internal details of DC-DC converter 110 and power amplifier 130 of component 100 implemented as a class-L amplifier, and described in detail in U.S. Pat. No. 9,319,495 as noted above, in an embodiment of the present disclosure. Speaker 150 is also shown in FIG. 7. All blocks of FIG. 7 other than output stage 200 may be powered by power supplies that are internally generated in either block 110 or 130.

DC-DC converter 110 is shown containing ABS (absolute value) block 710, summers (or summing junctions) 720 and 725, digital-to-analog converter (DAC) 730, headroom block 740, shoot-through management block 750, regulation block 760, inductor 765 and capacitor 766. Power amplifier 130 is shown containing digitizing block 790, DAC 770 and power amplification stage 200 (of FIG. 2).

Digitizing block 790 receives signal 791, and digitally samples signal 791 (at the appropriate sampling rate determined by the bandwidth of signal 791) to generate digital samples representing signal 791. Signal 791 may correspond to the output of a pre-amplifier (not shown) in power amplifier 130 that is designed to provide voltage gain to an input signal such as Vsig 131. Digitizing block 790 provides the digital samples sequentially on path 797. DAC 770 converts the samples into an analog signal. Stage 200 amplifies the analog signal to generate an amplified signal across terminals 130-P and 130M.

ABS block 710 computes the absolute value (i.e., magnitude only disregarding polarity/sign) of each digital sample received on path 797, and provides the absolute value to summer 720. Headroom block 740 provides a pre-determined digital value 741 representing the desired magnitude of headroom to summer 725. When a shoot-through condition is not present in output stage 200, the output 751 of shoot-through management block 750 is a zero. The output of summer 720 is therefore the sum of the output of ABS block and the headroom received on path 726. DAC 730 converts the output of summer 720 to an analog value, and provides the analog value to regulation block 760. It is noted that summers 720 and 725 need not be implemented as separate units, and their operation can be integrated within one or more of blocks 710, 740 and 750. Alternatively a single summing junction can be implemented in place of the combination of blocks 720 and 725.

Figure 8:
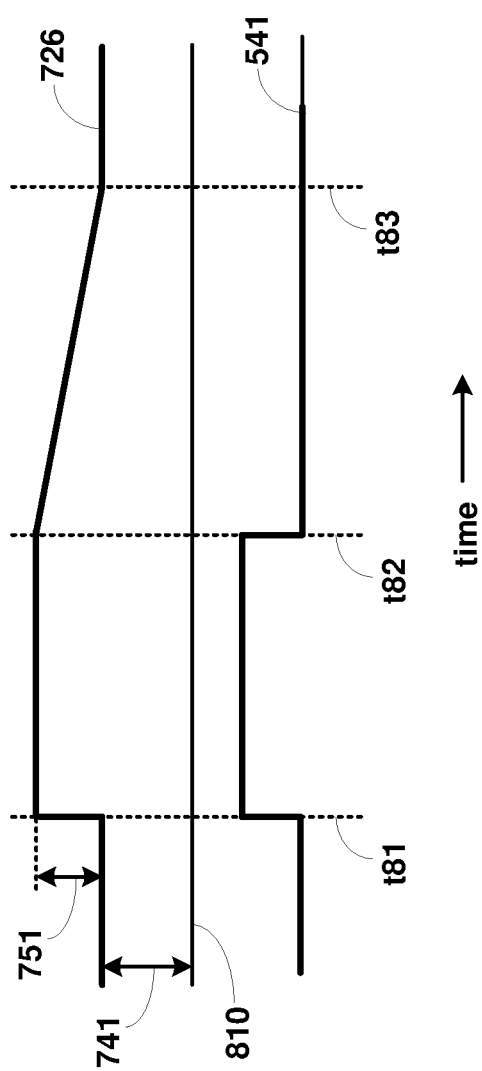
FIG. 8 is a diagram illustrating the manner in which a headroom voltage is varied in response to a shoot-through condition, in an embodiment of the present disclosure.

Regulation block may contain switches and control circuitry to operate the switches, and in conjunction with Vbat (101), inductor 765 and capacitor 766 operates to generate a regulated voltage Vpos (111) from power source Vbat, such that the instantaneous magnitude of Vpos is greater than the instantaneous absolute value of Vsig 131. Vpos provides power to output stage 200 for operation. The output of DAC 730 is connected to a REF (reference) input of regulation block 760. The internal control loop (not shown) within regulation block 760 generates Vpos 11 to equal the voltage received on the REF input Shoot-through management block 750 is connected to receive shoot-through detect signal 541. When a shoot-through condition is detected, shoot-through detect signal 541 is asserted. In response to signal 541 being asserted, shoot-through management block 750, generates a pre-determined digital value (margin value) which is added to headroom 741 by summer 725. FIG. 8 shows example waveforms for detect signal 541 and digital value 726. Line 810 denotes the zero reference level for signal 726. Prior to time instant t81, value 751 generated by shoot-through management block 750 is zero, since detect signal 541 indicates no shoot-through.

At t81, detect signal 541 is asserted. Accordingly, shoot-through management block 750 generates a pre-determined value on path 751. The pre-determined value represents the magnitude by which headroom 741 is to be increased. Accordingly digital value 726 is shown as the sum of values 741 and 751 at t81. Value 726 continues to be equal to sum of values 751 and 741, until t82, at which time instant detect signal 541 is de-asserted in response to no-shoot-through condition being detected. In response to signal 541 being de-asserted, shoot-through management block 750 begins to reduce the magnitude of value 751. Thus, value 751 is shown as gradually (at a pre-determined rate) reducing to zero at t83. However, the reduction of value 751 may in general be at any rate (constant or otherwise), and includes an abrupt reduction to zero.

It is to be understood that blocks 710, 720, 725, 740, and 750 may be operated at a rate that may be based on a clock signal (not shown). Further, although blocks 710, 720, 725, 740, and 750 are noted as digital blocks, in an alternative embodiment, such blocks may be replaced by analog elements which process/generate corresponding analog values to achieve the same effect (with digitizing block 790, DAC 730 and DAC 770 not being implemented).

Increasing the magnitude of headroom as described above enables removal of a clipped condition (as described above with respect to FIG. 3B), and allows the corresponding amplifier stage (e.g., 200 of FIG. 2B) to recover from a saturated state.

5. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 8, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power and ground terminals are referred to as constant reference potentials.

It should be further appreciated that the specific type of transistors (NMOS, etc.) noted above are merely by way of illustration. However, alternative embodiments using different configurations and transistors (e.g., bipolar transistors) will be apparent to one skilled in the relevant arts by reading the disclosure provided herein. For example, the NMOS transistors may be replaced with PMOS (P-type MOS) transistors (or a combination of PMOS and NMOS transistors), while also interchanging the connections to power and ground terminals.

Accordingly, in the instant application, power and ground terminals are referred to as constant reference potentials, the source and drain terminals of transistors (though which a current path is provided when turned on and an open path is provided when turned off) are termed as "current terminals", and the gate terminal is termed as a "control terminal". Furthermore, though the terminals are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method of managing a shoot-through condition in a component, said component comprising an amplifier that includes a push-pull output stage, said method comprising:
   mirroring a first current in a first transistor of said output stage to generate a first mirrored current;
   mirroring a second current in a second transistor of said output stage to generate a second mirrored current; and
   generating a sum of said first mirrored current and said second mirrored current; and
   when a magnitude of said sum exceeds a first pre-determined threshold, adjusting a respective control voltage of said first transistor and said second transistor to reduce said first current and said second current at least until said sum falls below a second pre-determined threshold.

2. The method of claim 1, wherein said mirroring said first current, said mirroring said second current, said generating, and said adjusting are continuously and concurrently performed,
   wherein said first pre-determined threshold equals said second pre-determined threshold, wherein said amplifier is powered for operation by a regulated voltage generated by a power supply regulator, said method further comprising:
   asserting a detect signal to indicate that said shoot-through condition exists when said magnitude of said sum begins to exceed said first pre-determined threshold; and
   increasing a magnitude of said regulated voltage by a first pre-determined value upon said asserting.

3. The method of claim 2, wherein said power supply regulator is a DC-DC converter comprised in said component.

4. The method of claim 3, further comprising:
   de-asserting said detect signal to indicate that said shoot-through condition no longer exists when said magnitude of said sum begins to fall below said first pre-determined threshold; and
   reducing said magnitude of said regulated voltage by said first pre-determined value upon said de-asserting.

5. The method of claim 4, wherein said reducing reduces said regulated voltage at a pre-determined rate.

6. The method of claim 5, wherein said amplifier receives an input signal and generates a corresponding amplified signal as an output of said push-pull stage,
   wherein said power supply regulator generates said regulated voltage to have an instantaneous magnitude greater than an instantaneous magnitude of the absolute value of said output by a second pre-determined value,
   wherein said component comprises a class-L power amplifier.

7. A component comprising:
   an amplifier containing a push-pull output stage, said output stage comprising a source-side transistor and a sink-side transistor; said push-pull output stage to provide an amplified signal by amplifying an input signal,
   wherein said amplifier comprise an analog shoot-through control block operable to:
   mirror a first current in said source-side transistor to generate a first mirrored current;
   mirror a second current in said sink-side transistor to generate a second mirrored current;
   generating a sum of said first mirrored current and said second mirrored current; and
   when a magnitude of said sum begins exceeds a first pre-determined threshold, adjusting a respective control voltage of said first transistor and said second transistor to reduce said first current and said second current at least until said sum falls below a second pre-determined threshold.

8. The component of claim 7, wherein said analog shoot-through control block is operable to perform said mirroring said first current, said mirroring said second current, said generating, and said adjusting continuously and concurrently, wherein said first pre-determined threshold equals said second pre-determined threshold, wherein said analog shoot-through control block comprises a sensing block, said sensing block comprising:
   a first transistor coupled to said source-side transistor to form a first current mirror, said first transistor to generate said first mirrored current;
   a second transistor coupled to said sink-side transistor to form a second current mirror, said second transistor to generate said second mirrored current;
   a current source to generate a reference current;
   a first current comparator to process said reference current and said first mirrored current to generate a first error current, wherein a magnitude of said first error current equals a magnitude of said first mirrored current when said magnitude of said first mirrored current is less than a magnitude of said reference current, said magnitude of said first error current being equal to the magnitude of the reference current when said magnitude of said first mirrored current is greater than or equal to said magnitude of said reference current;
   a second current comparator to process said reference current and said second mirrored current to generate a second error current, wherein a magnitude of said second error current equals a magnitude of said second mirrored current when said magnitude of said second mirrored current is less than said magnitude of said reference current, said magnitude of said second error current being equal to the magnitude of the reference current when said magnitude of said second mirrored current is greater than or equal to said magnitude of said reference current; and a current summer to generate, on an output terminal of said sensing block, a sum current of said first error current and said second error current.

9. The component of claim 8, wherein said analog shoot-through control block further comprises:
   a current sink coupled between said output terminal and a constant reference potential, said current sink to sink a current having a magnitude equal to said first pre-determined threshold;
   a third current mirror coupled to said output terminal, said third current mirror to sink a third current from a control terminal of said source-side transistor when said sum exceeds said first pre-determined threshold, said third current mirror being switched off when said sum falls below said first pre-determined threshold;
   a fourth current mirror coupled to said output terminal, said fourth current mirror to sink a fourth current from a control terminal of said sink-side transistor when said sum exceeds said first pre-determined threshold, said fourth current mirror being switched off when said sum falls below said first pre-determined threshold; and
   a detection block to assert a detect signal to indicate that a shoot-through condition exists when said sum begins to exceed said first pre-determined threshold, said detection block to de-assert said detect signal when said sum begins to fall below said first pre-determined threshold.

10. The component of claim 9, further comprising a DC-DC converter to generate a regulated voltage having an instantaneous magnitude greater than an instantaneous magnitude of the absolute value of said amplified signal by a second pre-determined value, wherein said amplifier receives said regulated voltage as a power supply voltage for operation, wherein said DC-DC converter comprises:
   a headroom block to generate a headroom value;
   a shoot-through management block, said shoot-through management block being coupled to receive said detect signal, said shoot-through management block to generate a margin value, wherein said margin value is a first predetermined value when said detect signal is asserted, said margin value being reduced to zero when said detect signal is de-asserted;
   a first summing junction to add said headroom value and said margin value to generate a first sum;
   an absolute value block to generate an absolute value of an instantaneous voltage of said amplified signal;
   a second summing junction to add said absolute value to said first sum to generate a second sum, wherein said second sum represents a reference voltage; and
   a regulation block to receive said reference voltage and to generate said regulated voltage to be equal in magnitude to said reference voltage.

11. The component of claim 10, wherein said shoot-through management block restores said margin value from said first pre-determined value to zero at a pre-determined rate upon said detect signal being de-asserted.

12. The component of claim 11, wherein each of said headroom block, said shoot-through management block, said first summing junction, said second summing junction and said absolute value block is implemented to process digital signals, said DC-DC converter further comprising a first digital-to-analog converter (DAC) to receive said second sum as a digital value, and to generate an analog signal representing said digital value.

13. The component of claim 12, wherein said amplifier further comprises:
   a digitizing block to generate digital samples representative of the magnitude of said amplified signal; and
   a second DAC to convert each of said digital samples to a corresponding analog signal, wherein said analog signal is provided as said input signal to said amplifier, said amplified signal being a power-amplified version of said analog signal,
   wherein said digital samples are also provided to said absolute value block.

14. The component of claim 7, wherein said component is a class-L amplifier.

* * * * *